United States Patent [19]

Dixon et al.

[11] Patent Number: 5,371,415
[45] Date of Patent: Dec. 6, 1994

[54] TWO STAGE GATE DRIVE CIRCUIT FOR A FET

[75] Inventors: Robert P. Dixon, Chandler; Randall C. Gray, Tempe, both of Ariz.

[73] Assignee: Motorola, Inc., Schaumburg, Ill.

[21] Appl. No.: 78,096

[22] Filed: Jun. 21, 1993

[51] Int. Cl.$^5$ .................. H03K 5/12; H03K 17/687
[52] U.S. Cl. ................... 327/109; 327/108; 327/379; 327/427
[58] Field of Search ............ 307/263, 268, 270, 296.6, 307/572

[56] References Cited

U.S. PATENT DOCUMENTS

| | | | |
|---|---|---|---|
| 4,142,113 | 2/1979 | Lundberg | 307/270 |
| 4,266,149 | 5/1981 | Yoshida | 307/270 |
| 4,992,683 | 2/1991 | Robin | 307/270 |

FOREIGN PATENT DOCUMENTS 2309810 12/1990 Japan .................... 307/572

*Primary Examiner*—William L. Sikes
*Assistant Examiner*—Tiep Nguyen
*Attorney, Agent, or Firm*—Bradley J. Botsch, Sr.

[57] ABSTRACT

A two stage gate drive circuit (10) for controlling a power transistor (12) has been provided. The drive circuit includes a first stage (14) coupled to a first supply voltage terminal for providing a high current drive signal to the power transistor for quickly switching on the power transistor. However, once the power transistor is turned on, the first stage becomes inactive and a second stage (16) coupled to a second supply voltage terminal provides a low current drive signal to the power transistor for fully enhancing the power transistor and lowering its on resistance. The gate drive circuit further includes a timer circuit (18) for rendering the first stage active for predetermined period of time.

12 Claims, 2 Drawing Sheets

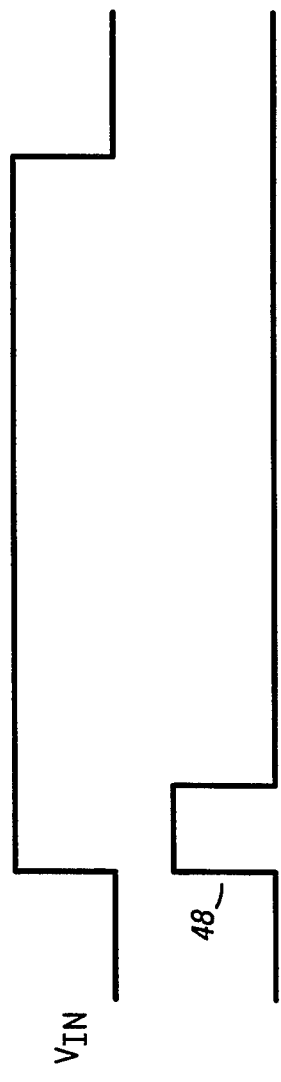
FIG. 2
FIG. 3
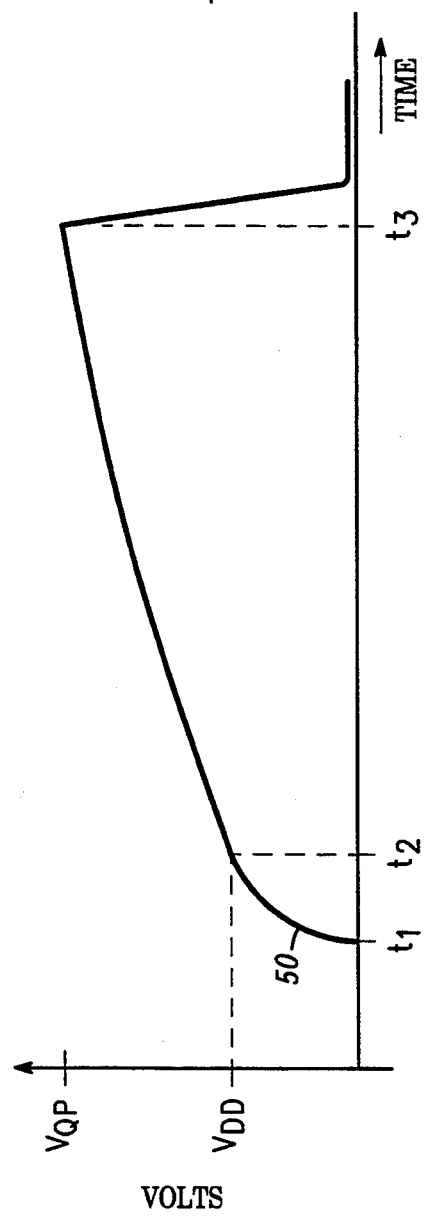
FIG. 4
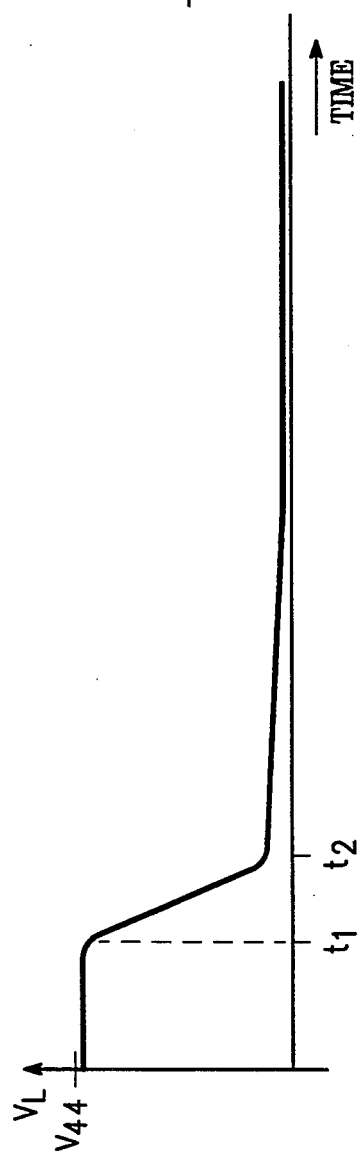
FIG. 5

TWO STAGE GATE DRIVE CIRCUIT FOR A FET

FIELD OF THE INVENTION

This invention relates to power transistors and, in particular but not limited to, a circuit for providing two stages of gate drive current to a power transistor.

BACKGROUND OF THE INVENTION

Power transistors may be utilized to switch on and off loads coupled thereto. When turning on the load (for example, an inductive load), the power transistor is switched on wherein it is desirable to have a high current signal to drive the gate electrode of the power transistor to quickly switch on the power transistor. However, once the power transistor is turned on, the high current, low voltage drive signal is no longer needed wherein a low current, high voltage signal is desirable for fully enhancing the power transistor while lowering its on drain-source resistance ($R_{DSON}$).

Most, if not all prior art techniques involve utilizing a single supply voltage to provide gate drive to the power transistor. Hence, the prior art is capable of only supplying a high current, low voltage drive signal or a low current, high voltage drive signal, but not both.

Hence, there exists a need for an improved drive circuit for a power transistor that provides a high current, low voltage drive signal for fast switching times and a low current, high voltage drive signal for allowing a low on resistance of the power transistor.

BRIEF DESCRIPTION OF THE DRAWINGS

FIGS. 2-5 illustrate graphical representations of various signals occurring within the two stage gate drive circuit shown in FIG. 1.

DETAILED DESCRIPTION OF THE DRAWINGS

Figure 1:
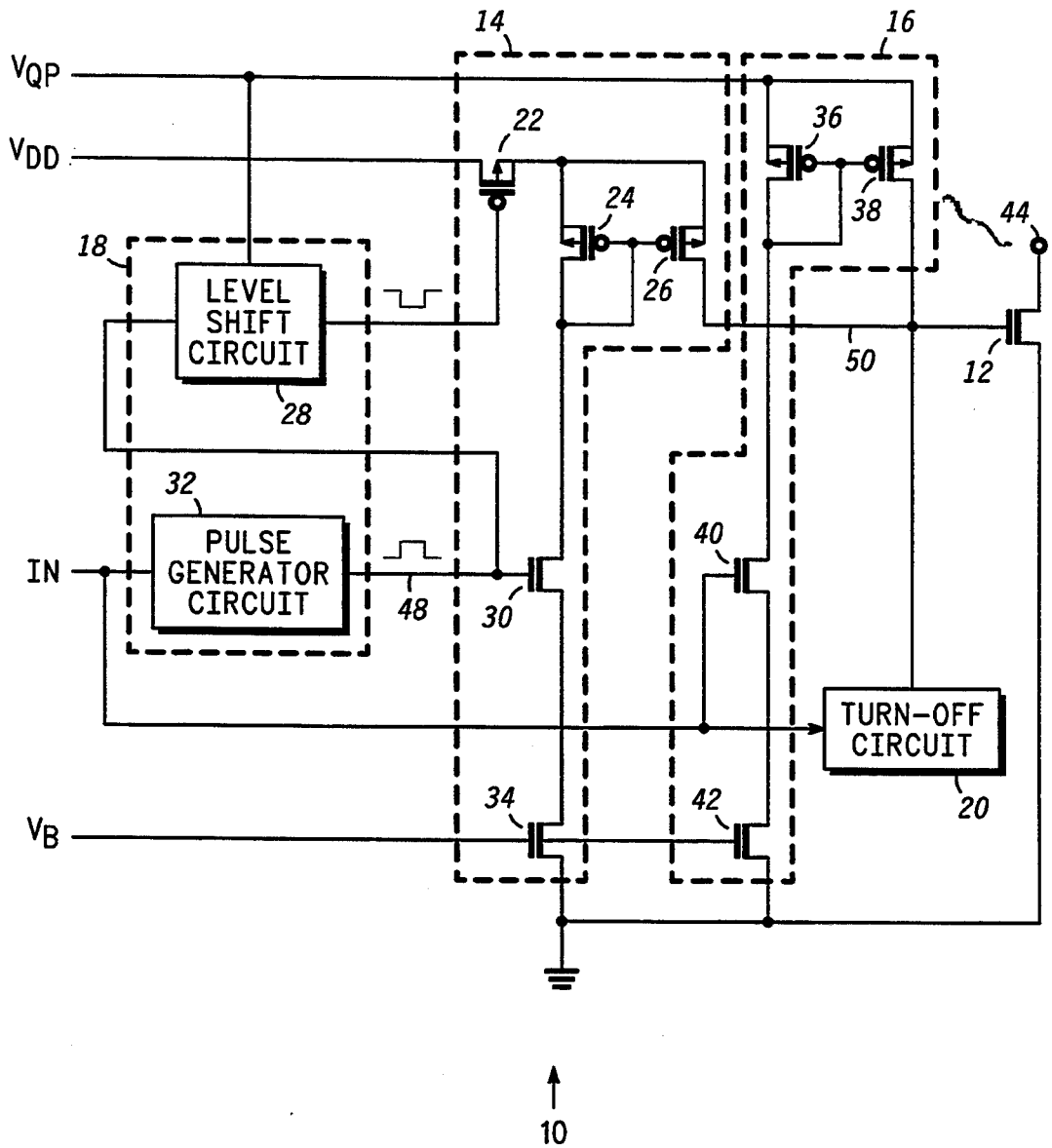
FIG. 1 is a detailed schematic/block diagram illustrating a two stage gate drive circuit for a power transistor in accordance with the present invention.

Referring to FIG. 1, two stage gate drive circuit 10 is shown for providing gate drive to power transistor/FET 12.

Briefly, two stage gate drive circuit 10 includes first stage 14 coupled to a first supply voltage terminal ($V_{DD}$) for providing a high current, low voltage drive signal to the gate electrode of transistor 12. Further, two stage gate drive circuit 10 includes second stage 16 coupled to a second supply voltage terminal ($V_{QP}$) for providing a low current, high voltage drive signal to the gate electrode of transistor 12 wherein voltage $V_{QP}$ is greater that voltage $V_{DD}$. Further, gate drive circuit 10 includes timer circuit 18 for rendering first stage 14 operative for a predetermined period of time and then disabling first stage 14 after the predetermined period of time. Finally, gate drive circuit 10 includes turn off circuit 20 for discharging the voltage appearing at the gate electrode of power transistor 12 thereby switching off power transistor 12 in response to an input voltage switching from a logic high voltage level to a logic low voltage level.

In particular, first stage 14 includes transistor 22 having a source electrode coupled to a first supply voltage terminal at which an operating potential Of $V_{DD}$ is applied. The drain electrode of transistor 22 is coupled to the source electrodes of transistors 24 and 26 while the gate electrode of transistor 22 is coupled to an output of level shift circuit 28.

The drain and gate electrodes of transistor 24 are coupled to the drain electrode of transistor 30 the latter of which has a gate electrode coupled to the output of pulse generator circuit 32. The gate electrode of transistor 26 is coupled to the gate electrode of transistor 24 while the drain electrode of transistor 26 is coupled to the gate electrode of power transistor 12.

The source electrode of transistor 30 is coupled to the drain electrode of transistor 34 the latter of which has a gate electrode coupled to receive a bias voltage as denoted by voltage $V_B$. The source electrode of transistor 34 is returned to ground reference.

Second stage 16 includes transistors 36 and 38 each having a source electrode coupled to a second supply voltage terminal at which the operating potential $V_{QP}$ is applied. The gate and drain electrodes of transistor 36 are coupled to the drain electrode of transistor 40 the latter of which has a gate electrode coupled to input voltage $V_{IN}$. The source electrode of transistor 40 is coupled to the drain electrode of transistor 42 the latter of which has a gate electrode coupled to bias voltage $V_B$. The source electrode of transistor 42 is returned to ground.

Transistor 38 has a gate electrode coupled to the gate electrode of transistor 36 and a drain electrode coupled to the gate electrode of power transistor 12.

Timer circuit 18 includes level shift circuit 28 and pulse generator circuit 32. In particular, pulse generator circuit 32 has an input responsive to input voltage $V_{IN}$ and an output for providing a pulse signal with a predetermined pulse width to the gate electrode of transistor 30 and to an input of level shift circuit 28. Further, level shift circuit 28 level shifts and inverts this predetermined pulse width signal appearing at the output of pulse generator circuit 32 and applies this level shifted inverted signal to the gate electrode of transistor 22.

Turn off circuit 20 has an input responsive to input voltage $V_{IN}$ and an output coupled to the gate electrode of power transistor 12.

Power transistor 12 has a drain electrode coupled to terminal 44 which is typically coupled to an inductive load (not shown). Further, the source electrode of power transistor 12 is returned to ground.

The backgates of transistors 24, 26, 30, 30, 34, 36, 38, 40 and 42 are coupled to their respective source electrodes as is typically done. However, the backgate of transistor 22 is coupled to its drain electrode thereby forming a diode across the backgate and drain electrodes of transistor 22 when first stage 14 is rendered inactive.

In describing the operation of gate drive circuit 10, it will be helpful to refer to the waveforms shown in FIGS. 2-5. In particular, FIG. 2 shows a typical input voltage waveform ($V_{IN}$) that is applied to the input of pulse generator circuit 32, to the gate electrode of transistor 40 and to an input of turn off circuit 20. FIG. 3 shows signal 48 which appears at the output of pulse generator circuit 32 and is applied to the gate electrode of transistor 30 and to the input of level shift circuit 28. FIG. 4 shows signal 50 which represents a voltage signal appearing at the gate electrode of power transistor 12. Also, FIG. 5 shows a voltage signal appearing at the drain electrode of transistor 12 (as well as terminal 44).

At time $t_1$, input voltage $V_{IN}$ transitions from a low to a high voltage thereby indicating a desire to turn on power transistor 12. In response thereto, transistor 40 is rendered operative and pulse generator circuit 32 provides at its output a pulse signal (signal 48 shown in FIG. 3) having a predetermined pulse width wherein signal 48 is subsequently applied to the gate electrode of transistor 30 thereby rendering transistor 30 operative for the predetermined pulse width time period that signal 48 is a logic high. Moreover, signal 48 is also applied to level shift circuit 28 which subsequently applies at its output an inverted and level shifted version of signal 48 which thereby functions to also render transistor 22 operative for the predetermined pulse width time period that signal 48 is a logic high. As a result, since transistor 30 as well as transistor 22 are rendered operative, first stage 14 is active and operating potential $V_{DD}$ is supplied to the current mirror comprised of transistors 24 and 26 thereby allowing transistor 26 to provide current drive to power transistor 12. First stage 14 is designed to provide a high current at a relatively low voltage ($V_{DD}$) to the gate electrode of power transistor 12 thereby providing a fast switching time for power transistor 12. In particular, referring to FIG. 4, from time interval $t_1$ to $t_2$, the gate electrode of power transistor 12 is quickly charged up to a voltage substantially equal to voltage $V_{DD}$. Moreover, referring to FIG. 5, during this time interval, the voltage appearing at the drain electrode decreases from a voltage near a voltage applied at a load $V_L$ to a substantially lower voltage, for example, 1 volt.

Further, during time interval $t_1$ to $t_2$, second stage 16 is also rendered operative since transistor 40 is rendered operative and the current mirror circuit comprised of transistors 36 and 38 is active such that transistor 38 functions to also provide current drive to the gate electrode of power transistor 12. However, since second stage 16 is designed to provide a relatively low current at a relatively high voltage ($V_{QP}$), most of the current drive that is used to charge a gate electrode of power transistor 12 during the time interval $t_1$ to $t_2$ is generated first stage 14.

At time $t_2$, the predetermined pulse width times out and signal 48 transitions from a logic high to a logic low level thereby rendering transistor 30 inoperative and transistor 22 (via level shift circuit 28) inoperative. Thus, first stage 14 becomes inactive and transistor 26 no longer provides a high current gate drive signal to power transistor 12.

But, second stage 16 is still rendered operative since transistor 40 is responsive to input voltage $V_{IN}$ and not to signal 48 as is first stage 14. As a result, during time interval $t_2$ to $t_3$, only transistor 38 provides the gate drive signal to the gate electrode of power transistor 12. Further, since transistor 38 provides a high voltage at a relatively low current, this has the effect of fully enhancing the power transistor 12 and lowering the drain-source on resistance ($R_{DSON}$) of power transistor 12. Further, referring back to FIG. 4 from time interval $t_2$ to $t_3$, the voltage appearing at the gate electrode of power transistor 12 increases from a voltage substantially equal to voltage $V_{DD}$ up to a voltage substantially equal to voltage $V_{QP}$ but at a much slower rate than the rate increase during time interval $t_1$ to $t_2$ since transistor 38 provides a lower current drive signal to the gate electrode of transistor 12. Moreover, referring to FIG. 5, during this time interval the voltage at the drain electrode of transistor 12 slowly decreases to an even lesser voltage, for example, to about 0.5 volts.

At time $t_3$, input voltage $V_{IN}$ finally transitions from a logic high to a logic low voltage level thereby rendering first and second stages 14 and 16 inactive. Further, this logic high to low transition on signal $V_{IN}$ enables turn off circuit 20 to discharge the voltage appearing at the gate electrode of power transistor 12 as shown in FIG. 4.

By now it should be apparent from the foregoing discussion that a novel two stage gate drive circuit for controlling a FET has been provided. The drive circuit includes a first stage coupled to a first supply voltage terminal for providing a high current, low voltage drive signal to the power FET for quickly switching on the power FET. However, once the FET is turned on, the first stage becomes inactive and a second stage coupled to a second supply voltage terminal provides a low current, high voltage drive signal to the FET for fully enhancing the FET and lowering its on resistance. The gate drive circuit further includes a timer circuit for rendering the first stage active for predetermined period of time.

While the invention has been described in specific embodiments thereof, it is evident that many alterations, modifications and variations will be apparent to those skilled in the art. Further, it is intended to embrace all such alterations, modifications and variations in the appended claims.

I claim:

1. A two stage current drive circuit for a power transistor, comprising:

a timer circuit having an input and first and second outputs, said input of said timer circuit responsive to an input voltage signal, said first and second outputs of said timer circuit providing first and second pulse signals having a predetermined pulse width;

a first current drive circuit having an input and an output and coupled to a first supply voltage terminal, said input of said first current drive circuit coupled to said first output of said timer circuit to receive said first pulse signal, said output of said first current drive circuit coupled to provide a first current drive signal to the power transistor, said first current drive circuit being active for a time period substantially equal to a time of said predetermined pulse width;

a second current drive circuit having an input and an output and coupled to second supply voltage terminal, said input of said second current drive circuit responsive to said input voltage signal said output of said second current drive circuit providing a second current drive signal to the power transistor wherein said second current drive signal provides a lower current than said first current drive signal; and a turn off circuit having an input and an output, said input of said turn off circuit responsive to said input voltage signal said output of said turn off circuit coupled to the power transistor for discharging a voltage appearing at a gate electrode of the power transistor when said input voltage signal switches from a logic high voltage level to a logic low voltage level.

2. The two stage current drive circuit according to claim 1 wherein a voltage applied to said first supply voltage terminal is less than a voltage supplied to said second voltage supply terminal.

3. The two stage current drive circuit according to claim 1 wherein said first current drive circuit includes:

a first transistor having first and second current carrying electrodes and a control electrode, said control electrode of said first transistor coupled to said second output of said timer circuit, said second current carrying electrode of said first transistor coupled to said first supply voltage terminal;

a second transistor having first and second current carrying electrodes and a control electrode, said control electrode of said second transistor coupled to said first current carrying electrode of said second transistor, said second current carrying electrode of said second transistor coupled to said first current carrying electrode of said first transistor;

a third transistor having first and second current carrying electrodes and a control electrode, said control electrode of said third electrode coupled to said control electrode of said second transistor, said first current carrying electrode of said third transistor coupled to the power transistor, said second current carrying electrode of said third transistor coupled to said second current carrying electrode of said second transistor;

a fourth transistor having first and second current carrying electrodes and a control electrode, said first current carrying electrode of said fourth transistor coupled to said first current carrying electrode of said second transistor, said control electrode of said fourth transistor coupled to said first output of said timer circuit;

a fifth transistor having first and second current carrying electrodes and a control electrode, said first current carrying electrode of said fifth transistor coupled to said second current carrying electrode of said fourth transistor, said control electrode of said fifth transistor coupled to receive a bias voltage, said second current carrying electrode of said fifth transistor coupled to a third supply voltage terminal.

4. The two stage current drive circuit according to claim 1 wherein said second current drive circuit includes:

a first transistor having first and second current carrying electrodes and a control electrode, said control electrode of said first transistor coupled to said first current carrying electrode of said first transistor, said second current carrying electrode of said first transistor coupled to said second supply voltage terminal, a second transistor having first and second current carrying electrodes and a control electrode, said first current carrying electrode of said second transistor coupled to the power transistor, said second current carrying electrode of said second transistor coupled to said second supply voltage terminal, said control electrode of said second transistor coupled to said control electrode of said first transistor;

a third transistor having first and second current carrying electrodes and a control electrode, said first current carrying electrode of said third transistor coupled to said first current carrying electrode of said first transistor, said control electrode of said third transistor coupled to receive said input voltage signal; and a fourth transistor having first and second current carrying electrodes and a control electrode, said first current carrying electrode of said fourth transistor coupled to said second current carrying electrode of said third transistor, said second current carrying electrode of said fourth transistor coupled to a third supply voltage terminal, said control electrode of said fourth transistor coupled to receive said bias voltage.

5. A two stage current drive circuit for a power transistor, comprising:

timing means for providing first and second output pulse signals having a predetermined pulse width, said timing means having an input coupled to receive an input voltage and first and second outputs for providing said first and second output pulse signals;

first circuit means having an output for providing a first current drive signal to the power transistor, said first circuit means coupled to a first supply voltage terminal at which a first voltage is applied thereat, said first circuit means having first and second inputs respectively coupled to said first and second outputs of said timing means for enabling said first circuit means when said first and second output pulse signals are in a first logic state;

second circuit means having an output for providing a second current drive signal to the power transistor, said second circuit means coupled to a second supply voltage terminal at which a second voltage is applied thereat, said second circuit means having an input coupled to receive said input voltage for enabling said second circuit means when said input voltage is in a first logic state, said first voltage being less than said second voltage and said first current drive signal being greater than said second current drive signal; and a turn off circuit having an input and an output, said input of said turn off circuit responsive to said input voltage, said output of said turn off circuit coupled to the power transistor for discharging a voltage appearing at a gate electrode of the power transistor when said input voltage switches from said first logic state to a second logic state.

6. The two stage current drive circuit according to claim 5 wherein said first circuit means includes:

a first transistor having first and second current carrying electrodes and a control electrode, said control electrode of said first transistor coupled to said second output of said timing means, said second current carrying electrode of said first transistor coupled to said first supply voltage terminal;

a second transistor having first and second current carrying electrodes and a control electrode, said control electrode of said second transistor coupled to said first current carrying electrode of said second transistor, said second current carrying electrode of said second transistor coupled to said first current carrying electrode of said first transistor;

a third transistor having first and second current carrying electrodes and a control electrode, said control electrode of said third electrode coupled to said control electrode of said second transistor, said first current carrying electrode of said third transistor coupled to the power transistor, said second current carrying electrode of said third transistor coupled to said second current carrying electrode of said second transistor;

a fourth transistor having first and second current carrying electrodes and a control electrode, said first current carrying electrode of said fourth transistor coupled to said first current carrying electrode of said second transistor, said control electrode of said fourth transistor coupled to said first output of said timing means;

a fifth transistor having first and second current carrying electrodes and a control electrode, said first current carrying electrode of said fifth transistor coupled to said second current carrying electrode of said fourth transistor, said control electrode of said fifth transistor coupled to receive a bias voltage, said second current carrying electrode of said fifth transistor coupled to a third supply voltage terminal.

7. The two stage current drive circuit according to claim 5 wherein said second circuit means includes:

a first transistor having first and second current carrying electrodes and a control electrode, said control electrode of said first transistor coupled to said first current carrying electrode of said first transistor, said second current carrying electrode of said first transistor coupled to said second supply voltage terminal, a second transistor having first and second current carrying electrodes and a control electrode, said first current carrying electrode of said second transistor coupled to the power transistor, said second current carrying electrode of said second transistor coupled to said second supply voltage terminal, said control electrode of said second transistor coupled to said control electrode of said first transistor;

a third transistor having first and second current carrying electrodes and a control electrode, said first current carrying electrode of said third transistor coupled to said first current carrying electrode of said first transistor, said control electrode of said third transistor coupled to receive said input voltage; and a fourth transistor having first and second current carrying electrodes and a control electrode, said first current carrying electrode of said fourth transistor coupled to said second current carrying electrode of said third transistor, said second current carrying electrode of said fourth transistor coupled to a third supply voltage terminal, said control electrode of said fourth transistor coupled to receive said bias voltage.

8. A method for providing two stage current drive to a power transistor, the method comprising the steps of:

generating first and second pulse signals that are in a first logic state for a predetermined period of time in response to an input voltage;

providing a first current drive circuit coupled to a first supply voltage terminal for providing a first current drive signal to the power transistor;

providing a second current drive circuit coupled to a second supply voltage terminal for providing a second current drive signal to the power transistor, said second current drive circuit responsive to said input voltage, said second current drive signal being less than said first current drive signal; and applying said first and second pulse signals to said first current drive circuit to enable said first current drive circuit only during said predetermined period of time that said first and second pulse signals are in said first logic state.

9. A two stage current drive circuit for a power transistor, comprising:

a timer circuit having an input and first and second outputs, said input of said timer circuit responsive to an input voltage signal, said first and second outputs of said timer circuit providing first and second pulse signals having a predetermined pulse width;

a first current drive circuit having an input and an output and coupled to a first supply voltage terminal, said input of said first current drive circuit coupled to said first output of said timer circuit to receive said first pulse signal, said output of said first current drive circuit coupled to provide a first current drive signal to the power transistor, said first current drive circuit being active for a time period substantially equal to a time of said predetermined pulse width, said first current drive circuit including a first transistor having a control electrode coupled to said second output of said timer circuit for receiving said second pulse signal, said first transistor allowing a voltage applied at said first supply voltage terminal to render said first current drive circuit operative during said time of said predetermined pulse width; and a second current drive circuit having an input and an output and coupled to a second supply voltage terminal, said input of said second current drive circuit responsive to said input voltage signal said output of said second current drive circuit providing a second current drive signal to the power transistor wherein said second current drive signal provides a lower current than said first current drive signal.

10. The two stage current drive circuit according to claim 9 further including a turn off circuit having an input and an output, said input of said turn off circuit responsive to said input voltage, said output of said turn off circuit coupled to the power transistor for discharging a voltage appearing at a gate electrode of the power transistor when said input voltage switches from a logic high voltage level to a logic low voltage level.

11. The two stage current drive circuit according to claim 9 wherein said first current drive circuit includes:

said first transistor having first and second current carrying electrodes and a control electrode, said control electrode of said first transistor coupled to said second output of said timer circuit, said second current carrying electrode of said first transistor coupled to said first supply voltage terminal;

said second transistor having first and second current carrying electrodes and a control electrode, said control electrode of said second transistor coupled to said first current carrying electrode of said second transistor, said second current carrying electrode of said second transistor coupled to said first current carrying electrode of said first transistor;

a third transistor having first and second current carrying electrodes and a control electrode, said control electrode of said third electrode coupled to said control electrode of said second transistor, said first current carrying electrode of said third transistor coupled to the power transistor, said second current carrying electrode of said third transistor coupled to said second current carrying electrode of said second transistor;

a fourth transistor having first and second current carrying electrodes and a control electrode, said first current carrying electrode of said fourth transistor coupled to said first current carrying electrode of said second transistor, said control electrode of said fourth transistor coupled to said first output of said timer circuit;

a fifth transistor having first and second current carrying electrodes and a control electrode, said first current carrying electrode of said fifth transistor coupled to said second current carrying electrode of said fourth transistor, said control electrode of said fifth transistor coupled to receive a bias voltage, said second current carrying electrode of said fifth transistor coupled to a third supply voltage terminal.

12. The two stage current drive circuit according to claim 9 wherein said second current drive circuit includes:

- a first transistor having first and second current carrying electrodes and a control electrode, said control electrode of said first transistor coupled to said first current carrying electrode of said first transistor, said second current carrying electrode of said first transistor coupled to said second supply voltage terminal,
- a second transistor having first and second current carrying electrodes and a control electrode, said first current carrying electrode of said second transistor coupled to the power transistor, said second current carrying electrode of said second transistor coupled to said second supply voltage terminal, said control electrode of said second transistor coupled to said control electrode of said first transistor;
- a third transistor having first and second current carrying electrodes and a control electrode, said first current carrying electrode of said third transistor coupled to said first current carrying electrode of said first transistor, said control electrode of said third transistor coupled to receive said input voltage; and
- a fourth transistor having first and second current carrying electrodes and a control electrode, said first current carrying electrode of said fourth transistor coupled to said second current carrying electrode of said third transistor, said second current carrying electrode of said fourth transistor coupled to a third supply voltage terminal, said control electrode of said fourth transistor coupled to receive said bias voltage.

* * * * *